United States Patent
Cho et al.

(10) Patent No.: US 7,253,663 B2
(45) Date of Patent: Aug. 7, 2007

(54) APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS

(75) Inventors: Junho Cho, Concord (CA); Nancy Chan, Richmond Hill (CA); Ramesh Senthinathan, Richmond Hill (CA); Stephen Yue, Richmond Hill (CA); Richard W Fung, Markham (CA)

(73) Assignee: ATI Technologies Inc., Markham, Ontario (CA)

( * ) Notice: Subject to any disclaimer, the term of this patent is extended or adjusted under 35 U.S.C. 154(b) by 5 days.

(21) Appl. No.: 11/160,243

(22) Filed: Jun. 15, 2005

(65) Prior Publication Data

US 2006/0284649 A1  Dec. 21, 2006

(51) Int. Cl.
*H03K 19/094* (2006.01)
(52) U.S. Cl. .................. 326/115; 326/121; 326/127; 326/83; 327/108; 327/87
(58) Field of Classification Search ............. 326/127, 326/115, 121
See application file for complete search history.

(56) References Cited

U.S. PATENT DOCUMENTS

| | | | | |
|---|---|---|---|---|
| 6,107,882 A | * | 8/2000 | Gabara et al. | 330/253 |
| 6,369,621 B1 | * | 4/2002 | Tinsley et al. | 327/108 |
| 6,677,802 B2 | * | 1/2004 | Strom et al. | 327/534 |
| 6,791,391 B2 | * | 9/2004 | Nishimura et al. | 327/333 |
| 6,847,232 B2 | * | 1/2005 | Tinsley et al. | 326/84 |
| 7,123,236 B2 | * | 10/2006 | Ker et al. | 345/98 |

OTHER PUBLICATIONS

Low-Voltage Differential Signaling: The International Engineering Consortium; from Web ProForum Tutorials, www.iec.org; pp. 1-15, date unknown.
Digital Visual Interface (DVI): InFocus Corporation Infocus Proxima; Nov. 2001; pp. 1-15.
Huq, Syed B. et al.; An Overview of LVDS Technology; National Semicoductor Application Note 971; Jul. 1998; pp. 1-6.

* cited by examiner

*Primary Examiner*—Vibol Tan
(74) *Attorney, Agent, or Firm*—Vedder, Price, Kaufman & Kammholz, P.C.

(57) ABSTRACT

The present disclosure relates to a differential signaling circuit including differential signaling circuitry having at least one output and one input, that can operate in multiple mode of operations while using a single, low voltage supply source. Two or more switches are included and configured to selectively couple a supply voltage to the output dependent on a mode of operation of the differential signaling circuitry. The circuit also includes a switch control biasing circuit operatively coupled to at least one of the switches and to the output of the differential signaling circuitry. The switch control biasing circuit provides a switch control biasing voltage to control a state of the switch based on a voltage level of the output. Further, a bulk biasing circuit is included and operatively coupled to the switch. The bulk biasing circuit selectively provides a bulk biasing voltage to the switch based on the voltage level of the output.

26 Claims, 4 Drawing Sheets

APPARATUS AND METHODS FOR SELF-BIASING DIFFERENTIAL SIGNALING CIRCUITRY HAVING MULTIMODE OUTPUT CONFIGURATIONS FOR LOW VOLTAGE APPLICATIONS

DESCRIPTION

The present application relates to apparatus and methods for self-biasing, multimode differential signaling circuit and, more particularly, providing self-biasing control of the differential signaling circuit with biasing circuits operable in multiple modes of operation in low voltage applications.

BACKGROUND

Differential signaling has become increasingly used for providing high-speed analog circuit techniques in order to effect higher bandwidth for digital data transfers and signaling that are also simple and cost effective. The use of differential signaling has proven beneficial in a number of different applications, including transmitting video digital signals to display devices, such as display monitors or screens.

Among the various differential signaling technologies utilized today in differential signaling, two examples include low voltage differential signaling (LVDS) and transition minimized differential signaling (TMDS). Each of these types of differential signaling technologies has inherent advantages. In order to be able to utilize the advantages inherent with each type of signaling technology, it is known to utilize differential signaling circuits operable in two or more modes of operation, each mode employing a different signaling technology. For example, it is known to utilize multimode differential output drivers operable to switch between LVDS and TMDS technologies. Attendant with each of these technologies, however, the output configurations and voltage levels are different. For example, LVDS may utilize a low voltage such as 1.8 volts, whereas TMDS typically utilizes a higher voltage supply such as 3.3 volts. As an example of a multimode output driver, FIG. 1 illustrates a dual mode differential signaling circuit 100 that is operable to provide either LVDS or TMDS signaling. The circuit 100 includes a pair of current steering transistors 102, 104, which are labeled MN1 and MN2. These transistors respectively receive input signals 106, 108 labeled as ID+ and ID−. The combination of the current steering transistors 102, 104 and a current source 110 effects differential signaling from a pair of outputs 112, 114 respectively connected to the current steering transistors 102 and 104.

When the circuit 100 is operated in an LVDS mode, under the control of some mode control 116, for example, a pair of current sources 118, 120 are coupled to the outputs 112 and 114, respectively, via a pair of switches 122, 124. This configuration is otherwise known as a current mode configuration where the constant current sources 118 and 120 drive current at the outputs 112 and 114. It is also noted that when operating in an LVDS mode, a termination resistor 130 is connected across the output contacts 112 and 114, the termination resistor 130 typically being connected across the lines connected to outputs 112 and 114 at a receiver (not shown). For purposes of illustration only, switches 126 and 128 indicate that the termination resistor 130 is only temporal, only being connected during LVDS modes.

For TMDS mode operation, an open drain configuration is effected to perform this type of signaling. Accordingly, a control, such as mode control 116, is utilized to open the switches 122 and 124, thereby ensuring that an internal pull-up structure to internal voltage source VDD is not coupled to the outputs 112 and 114. Moreover, a higher voltage, which is typical for TMDS, is connected to the outputs 112 and 114. This is illustrated in FIG. 1 as an additional voltage source 132, which may be 3.3 volts for this example. The voltage source 132 is connected to the outputs 112 and 114 via pull-up resistors 134 and 136 at a receiver (not shown). Also, for illustration purposes only, the voltage source 132 and pull-up resistors 134 and 136 are connected to the outputs 112 and 114 by switches 138 and 140 to indicate that the connections are temporal only during TMDS mode If the circuit of FIG. 1 is implemented within an integrated circuit, such as in ASICs including telecommunication chips, field programmable gate arrays, and other devices having differential output drivers, it is desirable in some applications to employ a lower voltage for the internal voltage source VDD. For example, a voltage level of 1.8 volts is typical for some integrated circuits. With a dual mode differential output driver such as the circuit of FIG. 1, when particular types of switching devices are utilized for switches 122 and 124 with a low voltage supply for VDD, certain modes of operation become problematic. For example, if NMOS transistors are utilized for switches 122 and 124 with a 1.8 voltage supply for VDD, operation of the circuit 100 in LVDS mode becomes inoperable. Specifically, the switches 122 and 124 turn off, thus the current sources 118 and 120, which are required for operation in LVDS mode, are not connected to the outputs 112 and 114. This is caused by a low voltage occurring between the gate and source of the NMOS devices resulting in no current flow from the current sources 118 and 120 to the outputs 112 and 114 and, thus, the termination resistor 130. Accordingly, no output voltage swing results and proper signaling does not occur.

In another example, if a PMOS transistor is utilized for switches 122 and 124 with a low voltage supply VDD of 1.8 volts during a TMDS mode, the circuit becomes inoperable for this type of signaling. Specifically, a reverse leakage current occurs from the external higher voltage source 132 (i.e., 3.3 volts) to the internal VDD supply of 1.8 volts because the switches 122 and 124, which are PMOS devices in this example, turn on due to a forward biasing of the diodes of the PMOS devices. Moreover, a current path arises from the drains of these PMOS devices to their substrate or bulk, which results in high leakage current and undesirable heating of the chip in which the circuit is located.

Accordingly, in conventional circuits such as the circuit of FIG. 1, a solution to the above problems has been to utilize an additional high voltage supply within the chip in order to implement TMDS (with a PMOS device as the switch), resulting in design restrictions and/or higher chip cost because of an additional voltage supply. An alternative conventional solution also has included using an on-chip voltage regulator to generate the necessary high voltage from the low voltage source. This generated high voltage then is used to bias switches 122 and 124, when implemented with PMOS devices, during the TMDS mode of circuit 100. Again, however, this solution utilizes more chip area within the integrated circuit and increases power consumption due to the use of an on-chip voltage regulator.

DETAILED DESCRIPTION OF THE PRESENT EXAMPLES

Figure 1:
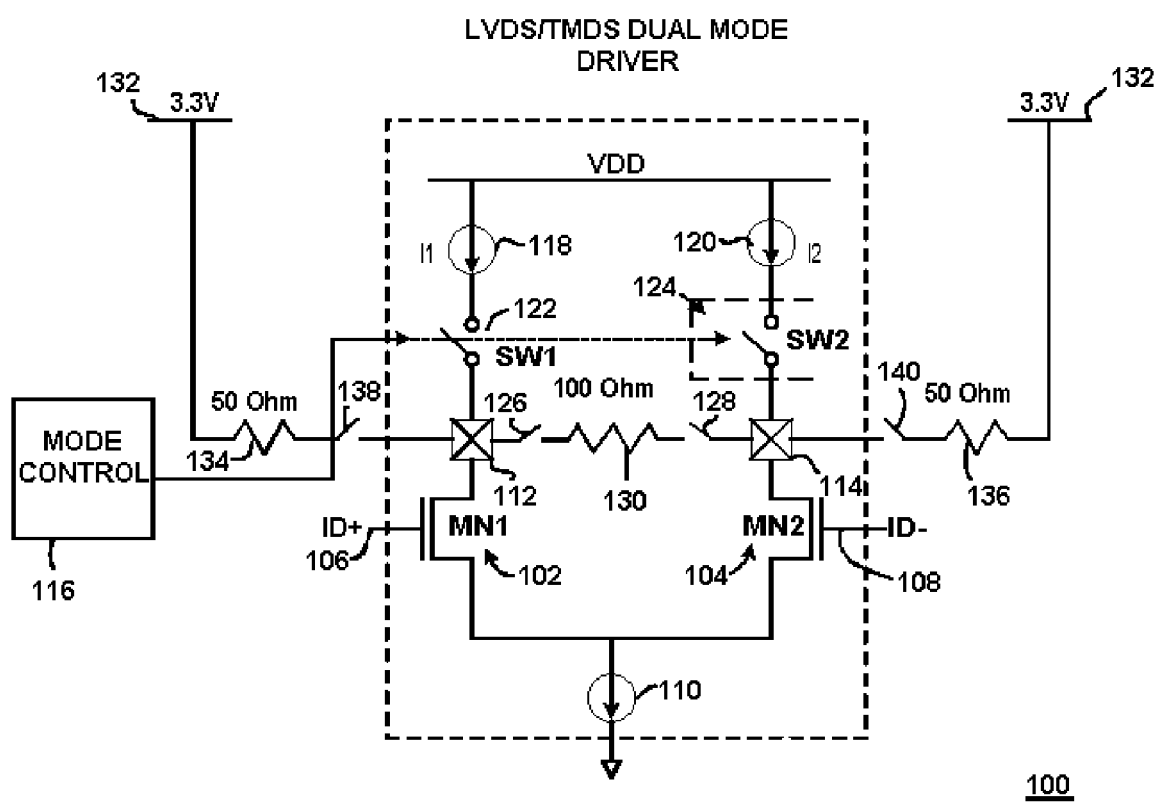
FIG. 1 illustrates an example of a conventional dual mode differential signaling circuit.

The present disclosure relates to a differential signaling circuit including differential signaling circuitry having at least one output and one input. A plurality of switches is included and configured to selectively couple a supply voltage to the output dependent on a mode of operation of the differential signaling circuitry. The circuit also includes a switch control biasing circuit operatively coupled to a switch of the plurality of switches and to the output of the differential signaling circuitry. The switch control biasing circuit is configured to provide a switch control biasing voltage to control a state of the switch based on a voltage level of the at least one output. Further, a bulk biasing circuit is included and operatively coupled to the switch. The bulk biasing circuit is configured to selectively provide a bulk biasing voltage to the switch based on the voltage level of the at least one output.

By including a switch control biasing circuit and a bulk biasing circuit, whose output biasing voltages are dependent on the voltage of the output of a differential signaling circuit, a low voltage source for the internal supply voltage VDD may be utilized with a differential signaling circuit without the need for an additional higher voltage supply or a voltage converter. Furthermore, the disclosed apparatus and methods achieve an output driver for differential signaling that is operable in different modes (e.g., LVDS and TMDS) with a single low power supply where proper switching is effected between current mode configurations and open drain configurations, for example, while a leakage current path is prevented when the voltage level of the output of the differential signaling circuit is higher than the internal voltage supply.

Additionally, a method for controlling a multimode differential signaling circuit with a switch that selectively couples a supply voltage to an output of the differential signaling circuit is disclosed. The method includes providing a switching biasing voltage to the switch, a level of the switching biasing voltage being dependent on a voltage level the output of the multimode differential signaling circuit. Additionally, a bulk biasing voltage is supplied to a bulk of the switch, a level of the bulk biasing voltage being dependent on the value of the output of the multimode differential signaling circuit.

Furthermore, the present application discloses a multimode differential signaling circuit that includes a switching circuit. The switching circuit includes a first terminal operatively coupled to a voltage supply and a second terminal coupled to an output terminal of the differential signaling circuit. Additionally, the switching circuit includes a control terminal operatively coupled to a control biasing voltage to selectively control electrical conduction from the first terminal to the second terminal, wherein the control biasing voltage is generated by a switch control biasing circuit configured to set the control biasing voltage dependent on the voltage level of the second terminal.

Figure 2:
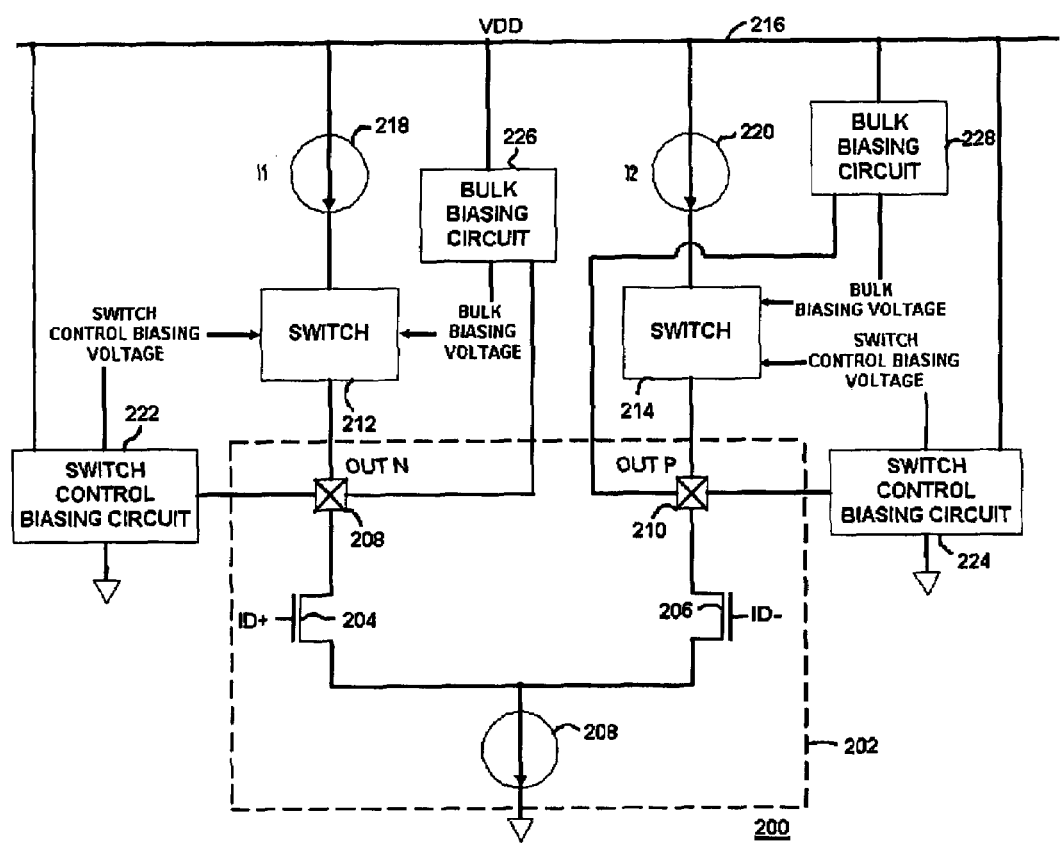
FIG. 2 illustrates an example of a multimode differential signaling circuit in accordance with the present disclosure.

FIG. 2 illustrates an example of a differential signaling circuit according to the present disclosure. The circuit 200 includes differential signaling circuitry 202 including current steering transistors 204 and 206 respectively connected to input signals ID+ and ID−. The transistors 204 and 206 are coupled to a current steering source 208 and also to a pair of output terminals 208 and 210 labeled as OUTN and OUTP. The circuit 200 also includes a pair of switches 212 and 214 having terminals connected to the outputs 208 and 210 of the differential signaling circuitry 202. The switches 212 and 214 selectively couple a supply voltage 216, labeled as VDD, to the outputs 208 and 210 via respective current sources 218 and 220. It is noted that these switches 212 and 214 correspond to switches 122 and 124 illustrated in the conventional circuit of FIG. 1.

Associated with each of the switches 212 and 214 is a respective switch control biasing circuit 222, 224. These circuits 222, 224 are coupled to the switches 212 and 214, respectively, in order to provide a switch control biasing voltage. This voltage effects control of the state of the switches 212, 214; that is, the switch control biasing voltage turns the switches 212, 214 on or off. The switch control biasing circuits 222, 224 are also operatively coupled to the output terminals 208 and 210 and set the switch control biasing voltage based on the voltage level present at the outputs 208 or 210. In particular, during a LVDS mode of the circuit, the switch control biasing circuits 222 and 224 provide a voltage of a particular level to turn on the switches 212 and 214, respectively, in order to connect the voltage supply 216 and the current sources 218 and 220 to the outputs 208 and 210. Conversely, when the circuit 200 operates in a TMDS mode, the levels of the outputs 208 and 210 are changed due to connection of an external high voltage supply (not shown, but equivalent to the supply voltage 132 of FIG. 1). The switch control biasing circuits 222 and 224 are configured to accordingly provide a switch control biasing voltage that ensures the switches 212 and 214 are turned off, thereby effecting TMDS operation.

The signaling circuit 200 also includes at least two bulk biasing circuits 226 and 228 associated with switches 212 and 214, respectively. In particular, the bulk biasing circuits 226 and 228 are operatively coupled to the switches 212, 214 and selectively provide a bulk biasing voltage to the switches 212, 214 based on the voltage level of the outputs 208, 210. In particular, the switches 212 and 214 are implemented using MOS transistors having a substrate or bulk and the bulk biasing circuits 226 and 228 are operative to provide a bulk biasing voltage to the bulks of switches 212 and 214 at a level commensurate with the output voltages on outputs 208 and 210 to prevent leakage current. In TMDS operation, for example, because the switch control biasing circuits 222, 224 provide control to turn off the switches 212, 214, a bulk biasing voltage ensures that leakage current does not occur from the output terminals 208 and 210 through the switches 212 and 214 to the lower internal voltage source 216.

In light of the above description, the circuit of FIG. 2 affords a differential signaling output driver that is universal for multiple modes of operation, such as LVDS and TMDS. By providing circuitry, such as switch control biasing circuit 222 and bulk biasing circuit 226, that derive a voltage level automatically tracking the output level at outputs 208 and 210, this universal functionality is effected. Furthermore, the circuit of FIG. 2 implements a universal differential output driver using a single, low power supply where the switches 212 and 214 may be turned off or on, dependent on the mode of operation, while also preventing leakage current when the voltage level of the outputs 208 and 210 are higher than the internal voltage supply 216.

Figure 3:
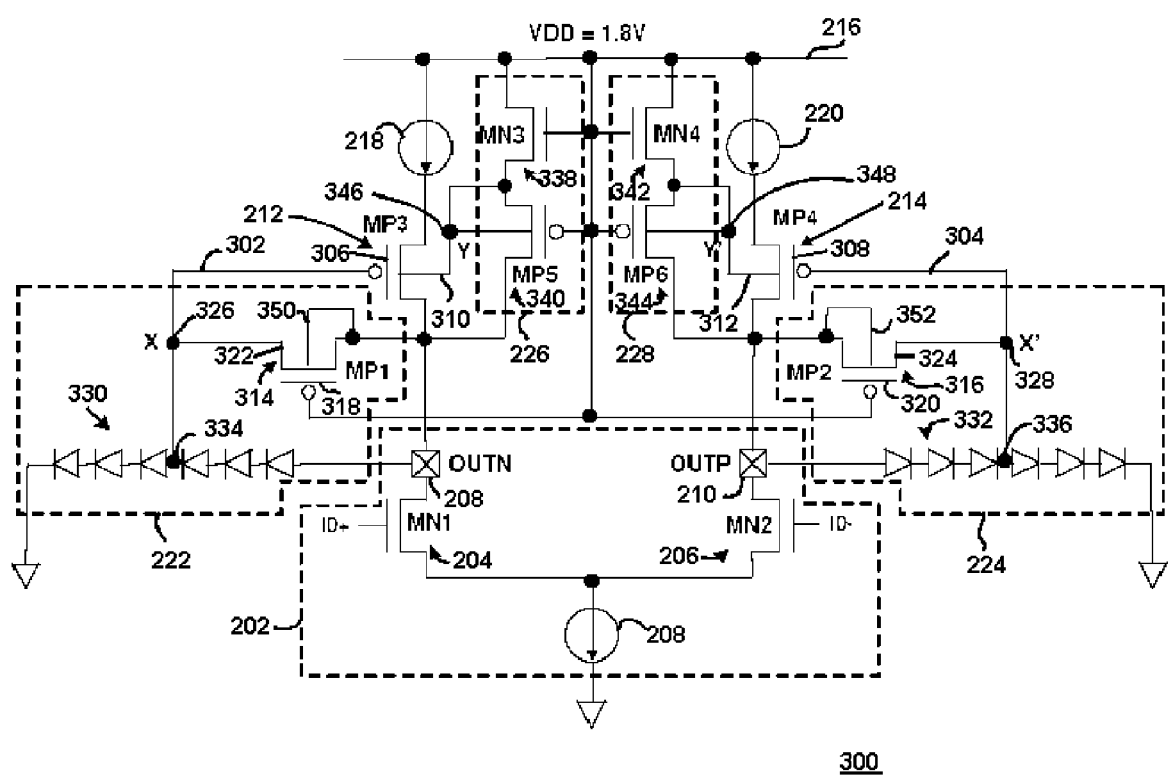
FIG. 3 illustrates an exemplary implementation of the circuit illustrated in FIG. 2.

FIG. 3 illustrates a circuit diagram of a specific implementation of the circuit of FIG. 2. It is noted that the same reference numbers are used in FIG. 3 to denote equivalent elements in this circuit to those in FIG. 2. As illustrated, the switches 212 and 214 are implemented as PMOS switches and are also labeled MP3 and MP4. Switching of these switches, 212, 214 is controlled by the switch control biasing circuits 222 and 224, respectively. In particular, the circuits 222 and 224 respectively output a control biasing voltage 302 and 304 to gates 306 and 308 of switches 212 and 214. Additionally, each of the switches 212 and 214 include a respective substrate or bulk terminal 310 and 312 connected to the bulk biasing circuits 226 and 228, respectively. Each of the bulk biasing circuits 226, 228 delivers the bulk biasing voltage to the bulk terminals of switches 212 and 214 in order to prevent leakage current path when the outputs 208 and 210 are greater than the internal voltage 216, such as in TMDS mode.

Within each of the switch control biasing circuits 222 and 224 is a respective switch 314 and 316. In the example of FIG. 3, each of these switches 314 and 316 is labeled MP1 and MP2 and are illustrated as PMOS type switches. The gates 318, 320 of these switches 314 and 316 are connected to the internal voltage source 216. Another terminal of both switches 314 and 316 are connected to respective output terminals 208 and 210. Another terminal 322, 324 of switches 314 and 316 is connected to a node 326, 328 (labeled X and X' for circuits 222 and 224, respectively). These nodes 326, 328 are connected to the gate terminals 306 and 308 of switches 212 and 214, respectively. Additionally, these nodes 326, 328 are respectively connected to voltage divides 330 and 332 discussed below.

As illustrated, each of the switch control biasing circuits 222 and 224 include a respective voltage divider 330 and 332 used to produce a voltage at nodes 326 and 328 that is proportional, but lower than the outputs 208 and 210. FIG. 3 illustrates that the voltage dividers 330 and 332 are constructed with a chain of diodes connected between the outputs 208 and 210 and a common voltage, such as ground. As will be recognized by those skilled in the art, however, any number of various types of devices may be utilized for performing voltage division. Additionally, the voltage dividers 330, 332 include taps 334, 336 interposed in the diode chain to derive a particular desired voltage level for the nodes 326 and 328.

In operation, the voltage divider circuit 330 works in conjunction with the switch 314, 316 to control the operation of the switches 314, 316 dependent on the voltage level of the output terminals 208 and 210. For example, if the voltages of the output terminals 208, 210 are lower than the internal voltage VDD (216), the voltages at taps 334, 336 are proportional, yet lower than the voltage at output terminals 208, 210. Accordingly, because the voltage at nodes 326, 328 are lower than the internal voltage supply 216, the switches 314 and 316 are turned off, thereby isolating the nodes 326, 328 from the outputs 208 and 210. Moreover, because the voltage divider circuits 330 and 332 cause a voltage drop between the output terminals 208, 210 and the taps 334, 336 the reduced voltage present at nodes 326, 328 reduce the control signal voltage levels 302 and 304 such that PMOS switches 212 and 214 turn on. When the switches 212, 214 are turned on, the current supplies 218, 220 are then connected to the output terminals 208, 210 for a current node configuration, such as in LVDS operation.

In an alternative example, if the voltage of the outputs 208, 210 are much higher than the internal voltage 216, such as during a TMDS mode where 3.3 volt sources are connected by pull up resistors to the output terminals 208, 210 (see FIG. 1 as an example). In this case, because the voltages of the outputs 208, 210 are much higher than the internal voltage 216, the switches 314 and 316 will turn on. Accordingly, the voltages at terminals 326 and 328 become similar to the output voltages 208, 210 as the switches 314, 316 are typically selected to have a very small turn-on resistance and, thus, the voltages will be essentially the same. In turn, because the voltages 326 and 328 are high like the output terminals, 208, 210, the switches 212 and 214 are turned off, thereby ensuring that an open-drain configuration is effected for switches 212 and 214.

Based on the foregoing discussion, the switch control biasing circuits 222, 224 are operable to provide an appropriate switch control biasing voltage, 302, 304 for various modes of operation, namely LVDS and TMDS modes. In LVDS mode, the output terminals 208, 210 typically have a voltage range between 0.8 volts and 1.7 volts, which is lower than the typical VDD voltage of 1.8 volts. Accordingly, as explained above, the switches 314 and 316 are turned off at these voltage levels and switches 212 and 214 are turned on, in turn. Alternatively, in TMDS mode the output voltage levels of outputs 208 and 210 typically have voltages between 2.7 volts and 3.3 volts, which are much higher than the typical internal source voltage VDD of 1.8 volts. Accordingly, as explained above, the switches 314 and 316 are turned on and switches 212 and 214 are, in turn, turned off.

Circuit 300 of FIG. 3 also includes, as mentioned previously, at least one bulk biasing circuit. As shown, the circuit in FIG. 3 includes two bulk biasing circuits 228 and 226 that serve to bias the substrate or bulks of switches 212 and 214, respectively. Each of the bulk biasing circuits 226, 228 include a series connected pair of switches, which are labeled MN3 and MP5 for circuit 226 and MN4 and MP6 for circuit 228. These switches are respectively labeled also with reference numbers 338, 340, 342, and 344. As illustrated, each of the switches 338, 342 and 344 have drain terminals connected to the internal voltage source 216. Additionally, each series connected pair includes an NMOS transistor (i.e., 338 and 342) and a PMOS transistor (i.e., 340 and 344). Junction nodes 346 and 348 of these respective pairs of transistors are respectively connected to the bulk terminals 310 and 312 of switches 212 and 214 for the purpose of providing a bulk biasing voltage to prevent leakage currents, particularly when the circuit 300 is in TMDS mode.

In operation, the switches 338 and 342 (MN3 and MN4) are always turned off, regardless of whether the circuit 300 is operated in LVDS or TMDS modes, for example. During LVDS mode, in particular, the switches 340 and 344 are turned off. Assuming an LVDS operation where the common level output on outputs 208 and 210 is approximately 1.2 volts, the switches 338, 340, 342, 344 are all turned off and the voltage present at nodes 346 and 348 (Y and Y') would be approximately 1.6 to 1.7 volts assuming a VDD equal to 1.8 volts. In TMDS mode, however, the switches 340 and 344 are turned on due to a voltage present at the outputs 208 and 210 being greater than the internal voltage supply voltage 216. Thus, assuming a typical TMDS output voltage of 3.3 volts of input or a common voltage of approximately 3 volts, the voltage level present at nodes 346 and 348 will be approximately equal to the voltage at the output terminals 208 and 210. In other words, the voltage level present at the output terminals 208 and 210 is effectively coupled to the bulk terminals of switches 212 and 214. Accordingly, a sufficient voltage is provided to the bulk terminals 310 and 312 of switches 212 and 214 to prevent leakage current through the substrate or bulk of these switches flowing from the output terminals 208 and 210 to the internal voltage 216.

Of further note, the switches 314 and 316 also include a bulk terminal connection 350, 352 to the source terminals of these switches, in particular, in order to prevent leakage current from output terminals 208 and 210 to the internal voltage 216 during the TMDS mode. Moreover, in the example of FIG. 3, switches 340 and 344 also have a bulk terminal connected to the nodes 346 and 348, respectively, in order to ensure no leakage current occurs in these switching devices.

Figure 4:
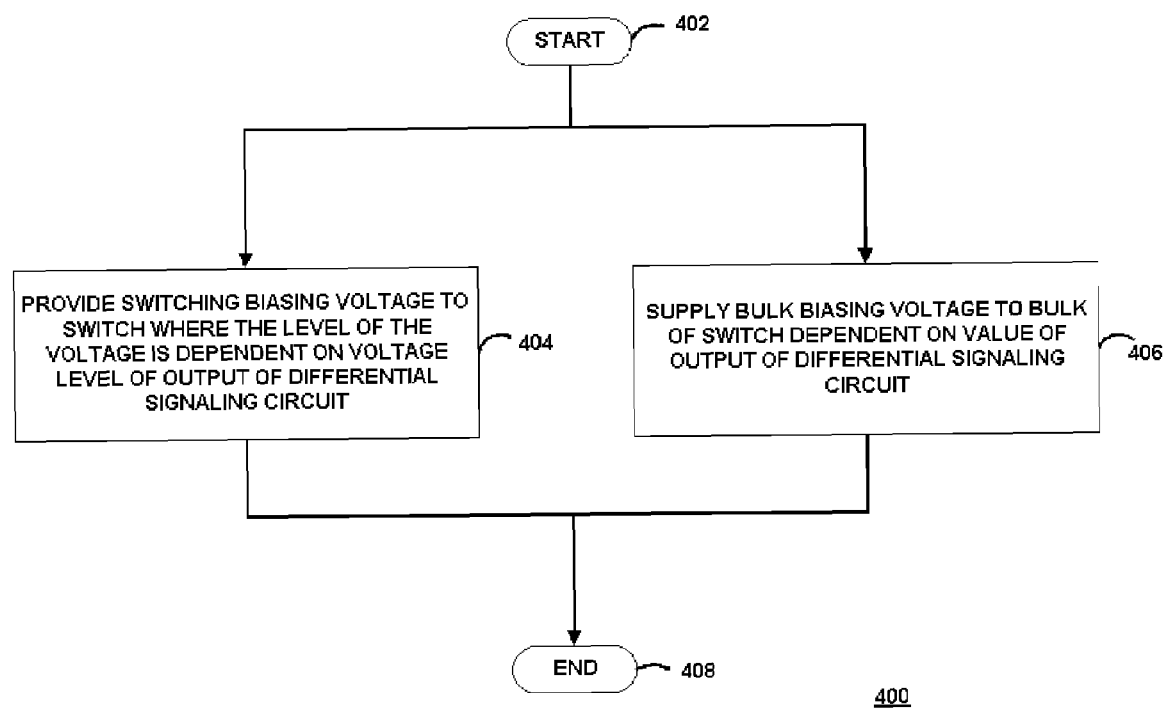
FIG. 4 illustrates an exemplary flow diagram of a method in accordance with the present disclosure.

FIG. 4 illustrates an example of a method for controlling the multi mode differential signaling circuit, such as the circuits of FIGS. 1 and 2, with a control bias switch that is dependent of the voltage level of the output of the differential signaling circuit. As illustrated, a flow diagram 400 begins at a start block 402. After initialization, flow proceeds to block 404 where a bias voltage is provided to a switch in a multi-mode differential output circuit. This is performed, for example, by the switch control biasing circuits 222, 224 when providing the switch control biasing voltage to switches 212 and 214. Additionally, at block 404, the level of the voltage is set dependent on the voltage level of the output of the differential signaling circuit. This is, as described previously, based on circuitry that, for example, provides a switch control voltage of sufficient level to turn off the switches 212 or 214 during a TMDS mode and deliver a voltage of sufficient level to ensure that the switches 212 and 214 turn on during an LVDS mode.

Simultaneous with block 404, flow also proceeds from block 402 to block 406 where a bulk biasing voltage is supplied to a bulk of the switches dependent on a value of the output of the differential signaling circuit. Again, as described previously, the bulk biasing circuits 226 and 228 provide an example of this functionality where, dependent on the voltage at terminals 208 or 210, the switches 340 or 344 are turned on or off in order to selectively apply a bulk biasing voltage sufficient to ensure no leakage in switches in 212 and 214. In particular, during TMDS mode the switches 340 and 344 are turned on in order to ensure that switches 212 and 214, which are turned off during this mode, are bias to prevent leakage current through the bulk of these devices. Flow then proceeds from both blocks 404 and 406 to block 408 where the method ends. It is noted that, although the method illustrated in FIG. 4 shows simultaneous sequential blocks 404 and 406, the processes indicated therein may occur simultaneously, as shown, or may also occur at slightly different times.

Based on the foregoing, one of ordinary skill in the art will appreciated that by including a switch control biasing circuit and a bulk biasing circuit whose output voltages are automatically dependent on the voltage of the output of a differential signaling circuit, proper operation of the multi-mode differential signaling circuit using only a low voltage source for VDD may be realized without the need for an additional higher voltage supply. Furthermore, the above-disclosed apparatus and methods achieve a differential signaling circuit that is operable in different modes (e.g., LVDS and TMDS) with a single low power supply where proper switching is effected between current mode configurations and open drain configurations while leakage current is prevented in the switch, which selectively connects the internal voltage to the output, when the voltage level of the output of the differential signaling circuit is higher than the internal voltage supply.

One of ordinary skill in the art will further appreciate that although specific PMOS and NMOS switching devices are disclosed in the above examples, any suitable switching devices may be utilized to realize the disclosed apparatus and methods. Moreover, it is also conceivable that other suitable circuit configurations may be used to achieve the functionalities described above.

Furthermore, the differential signaling circuits of FIGS. 2 and 3 may also be implemented within an integrated circuit (not shown), such as within ASICs including graphics processing chips, telecommunication chips, field programmable gate arrays, and any other circuits or devices integrating differential output drivers. As discussed previously, it is desirable in some integrated circuit applications to employ a lower voltage for the internal voltage source VDD (e.g., 1.8 volts). Thus, the disclosed apparatus and methods, which implement a multimode differential signaling circuit that correctly operates at lower voltage across multiple modes, are well suited for implementation in integrated circuits.

The above detailed description of the examples described herein have been presented for the purposes of illustration and description only and not by limitation. It is therefore contemplated that the present application cover any and all modifications, variations or equivalents that fall within the spirit and scope of the basic underlying principles disclosed above and the appended claims.

What is claimed is:

1. A differential signaling circuit comprising:
   differential signaling circuitry having at least one input and at least one output;
   a plurality of switches configured to selectively couple a supply voltage to the at least one output dependent on a mode of operation of the differential signaling circuitry;
   a switch control biasing circuit operatively coupled to a switch of the plurality of switches and to the at least one output of the differential signaling circuitry, and configured to provide a switch control biasing voltage to control a state of the switch based on a voltage level of the at least one output; and
   a bulk biasing circuit operatively coupled to the switch and configured to selectively provide a bulk biasing voltage to the switch based on the voltage level of the at least one output.

2. The differential signaling circuit as defined in claim 1, wherein the switch control biasing circuit comprises:
   a voltage divider circuit coupled between the at least one output and a common potential, the divider circuit having a tap to supply a divided voltage level; and
   a biasing transistor having a first terminal coupled to the at least one output, a second terminal coupled to the tap and an input of the switch, and a third terminal coupled to the supply voltage.

3. The differential signaling circuit as defined in claim 2, wherein the voltage dividing circuit includes a series connection of diodes coupled between the output and the common potential.

4. The differential signaling circuit as defined in claim 1, wherein the bulk biasing circuit includes:
   a series connection having a first transistor of a first type and a second transistor of a second type connected at a node, where the series connection is coupled between the supply voltage and the output, wherein the node is coupled to a bulk of the switch.

5. The differential signaling circuit as defined in claim 4, wherein the first and second transistor are respectively NMOS and PMOS transistors each having a gate connected to the supply voltage.

6. The differential signaling circuit as defined in claim 1, wherein the particular mode of operation includes at least one or more of an open drain configuration of the differential signaling circuitry where the supply voltage is not coupled to the output of the differential signaling circuitry by the plurality of switches and a current mode configuration of the differential signaling circuitry where the supply voltage is coupled to the output of the differential signaling circuitry by the plurality of switches.

7. The differential signaling circuit as defined in claim 6, wherein the open drain configuration is operative to provide transmission minimized differential signaling (TMDS).

8. The differential signaling circuit as defined in claim 6, wherein the current mode configuration is operative to provide low voltage differential signaling (LVDS).

9. A method for controlling a multimode differential signaling circuit with a switch that selectively couples a supply voltage to an output of the differential signaling circuit, the method comprising:
   providing a switching biasing voltage to a terminal of the switch to control an on/off state of the switch, a level of the switching biasing voltage being dependent on a voltage level of the output of the multimode differential signaling circuit; and
   supplying a bulk biasing voltage to a bulk of the switch, a level of the bulk biasing voltage dependent on the voltage level of the output.

10. The method as defined in claim 9, wherein the switching biasing voltage sets the switch an on state responsive to the voltage level of the output being at a first level and sets the switch to an off state responsive to the voltage level of the output being at a second level, wherein the second level is greater than the first level.

11. The method as defined in claim 9, wherein providing the switching biasing voltage further includes:
   dividing the voltage level of the output to derive a divided voltage level less than the voltage level of the output;
   supplying the divided voltage level to the terminal of the switch; and
   selectively coupling the output to the terminal of the switch dependent on the voltage level of the output and the divided voltage level.

12. The method as defined in claim 9, wherein supplying the bulk biasing voltage includes:
   selectively coupling the output to the bulk of the switch responsive to the voltage level of the output being greater than an internal supply voltage of the multimode differential signaling circuit.

13. An integrated circuit comprising:
   a differential signaling circuit including:
      differential signaling circuitry having at least one input and at least one output;
      a plurality of switches configured to selectively couple a supply voltage to the at least one output dependent on a mode of operation of the differential signaling circuitry;
      a switch control biasing circuit operatively coupled to a switch of the plurality of switches and to the at least one output of the differential signaling circuitry, and configured to provide a switch control biasing voltage to control a state of the switch based on a voltage level of the at least one output; and
      a bulk biasing circuit operatively coupled to the switch and configured to selectively provide a bulk biasing voltage to the switch based on the voltage level of the at least one output.

14. The integrated circuit as defined in claim 13, wherein the switch control biasing circuit comprises:
   a voltage divider circuit coupled between the at least one output and a common potential, the divider circuit having a tap to supply a divided voltage level; and
   a biasing transistor having a first terminal coupled to the at least one output, a second terminal coupled to the tap and an input of the switch, and a third terminal coupled to the supply voltage.

15. The integrated circuit as defined in claim 14, wherein the voltage dividing circuit includes a series connection of diodes coupled between the output and the common potential.

16. The integrated circuit as defined in claim 13, wherein the bulk biasing circuit includes:
   a series connection having a first transistor of a first type and a second transistor of a second type connected at a node, where the series connection is coupled between the supply voltage and the output, wherein the node is coupled to a bulk of the switch.

17. The integrated circuit as defined in claim 16, wherein the first and second transistor are respectively NMOS and PMOS transistors each having a gate connected to the supply voltage.

18. The integrated circuit as defined in claim 13, wherein the particular mode of operation includes at least one or more of an open drain configuration of the differential signaling circuitry where the supply voltage is not coupled to the output of the differential signaling circuitry by the plurality of switches and a current mode configuration of the differential signaling circuitry where the supply voltage is coupled to the output of the differential signaling circuitry by the plurality of switches.

19. The integrated circuit as defined in claim 18, wherein the open drain configuration is operative to provide transmission minimized differential signaling (TMDS).

20. The integrated circuit as defined in claim 18, wherein the current mode configuration is operative to provide low voltage differential signaling (LVDS).

21. A multimode differential signal circuit comprising:
   an output terminal;
   a switch contol biasing circuit operative to generate a control biasing voltage;
   a switch circuit including:
      a first terminal operatively coupled to a voltage supply;
      a second terminal coupled to the output terminal; and
      a control terminal operatively responsive to the control biasing voltage to selectively control electrical conduction between the first terminal to the second terminal, wherein the control biasing voltage is dependant on a voltage level of the second terminal; and
   wherein the switch control biasing circuit includes:
      a voltage divider circuit coupled between the output terminal and a common potential, the divider circuit having a tap to supply a divived voltage level; and
      a biasing transistor having a first biasing transistor terminal coupled to the output terminal, a second biasing transistor terminal coupled to the tap and the control terminal of the switch, and a third biasing transistor terminal coupled to the voltage supply.

22. The multimode differential signaling circuit as defined in claim 21, wherein the voltage dividing circuit includes a series connection of diodes coupled between the output and the common potential.

23. The multimode differential signaling circuit as defined in claim 21, wherein the switch control biasing circuit is operative to select between providing transmission minimized differential signaling (TMDS) and low voltage differential signaling (LVDS) dependent on a voltage level of the output terminal.

24. A multimode differential signaling circuit comprising:
   an output terminal;
   a switch control biasing circuit operative to generate a control biasing voltage;
   a switching circuit including;
      a bulk;
      a first terminal operatively coupled to a voltage supply;
      a second terminal coupled to the output terminal; and
      a control terminal operatively responsive to the control biasing voltage to selectively control electrical conduction between the first terminal to the second terminal, wherein the control biasing voltage is dependent on a voltage level of the second terminal; and
   a bulk biasing circuit operatively coupled to bulk and configured to selectively provide a bulk biasing voltage to the bulk based on a voltage level of the output terminal.

25. The multimode differential signaling circuit as defined in claim 24, wherein the bulk biasing circuit includes:
   a first transistor of a first type having a first terminal operatively coupled to the voltage supply and a second terminal;
   a second transistor of second type having a first terminal operatively coupled to the output terminal and a second terminal;
   wherein the second terminal of the first transistor and the second terminal of the second transistor are coupled in series at a node; and
   wherein the node is operatively coupled to the bulk.

26. The multimode differential signaling circuit as defined in claim 25, wherein the first and second transistor are respectively NMOS and PMOS transistors each having a gate connected to the voltage supply.

* * * * *